United States Patent
Kang et al.

(10) Patent No.: US 12,243,724 B2
(45) Date of Patent: Mar. 4, 2025

(54) BATCH TYPE SUBSTRATE PROCESSING APPARATUS

(71) Applicant: EUGENE TECHNOLOGY CO., LTD., Yongin-Si (KR)

(72) Inventors: Sung Ho Kang, Yongin-si (KR); Chang Dol Kim, Yongin-si (KR); Jun Kim, Yongin-si (KR); Suk Bum Yoo, Yongin-si (KR); Choon Sik Jeong, Yongin-si (KR)

(73) Assignee: EUGENE TECHNOLOGY CO., LTD. (KR)

( * ) Notice: Subject to any disclaimer, the term of this patent is extended or adjusted under 35 U.S.C. 154(b) by 133 days.

(21) Appl. No.: 18/108,009

(22) Filed: Feb. 9, 2023

(65) Prior Publication Data
US 2023/0253191 A1  Aug. 10, 2023

(30) Foreign Application Priority Data

Feb. 10, 2022  (KR) .................. 10-2022-0017524

(51) Int. Cl.
*H01J 37/32*  (2006.01)

(52) U.S. Cl.
CPC .. *H01J 37/32568* (2013.01); *H01J 37/32091* (2013.01); *H01J 37/3244* (2013.01); *H01J 37/32559* (2013.01); *H01J 2237/002* (2013.01)

(58) Field of Classification Search
CPC ........... H01J 37/32568; H01J 37/32091; H01J 37/3244; H01J 37/32559; H01J 2237/002; H01J 37/32541; H01J 37/32532; H01J 37/32449; H01J 37/32522; H01J 2237/3321
See application file for complete search history.

(56) References Cited

U.S. PATENT DOCUMENTS 11,924,944 B1 * 3/2024 Wu .................. H05B 47/12
2020/0312632 A1 * 10/2020 Hara ................ C23C 16/4584

FOREIGN PATENT DOCUMENTS

| CN | 105190825 B | * 11/2018 | .............. F16C 11/04 |
| CN | 112563109 A | * 3/2021 | ....... C23C 16/45536 |

(Continued)

*Primary Examiner* — Abdullah A Riyami
*Assistant Examiner* — Syed M Kaiser
(74) *Attorney, Agent, or Firm* — Renaissance IP Law Group LLP

(57) ABSTRACT

Provided is a batch type substrate processing apparatus that generates plasma by a plurality of electrodes to perform a processing process on a substrate. The batch type substrate processing apparatus includes a reaction tube, a plurality of electrodes disposed to be spaced apart from each other, and an electrode protection part configured to protect the plurality of electrodes. The plurality of electrodes includes first and second power supply electrodes spaced apart from each other, and a ground electrode provided between the first power supply electrode and the second power supply electrode. The electrode protection part includes a plurality of first electrode protection tubes provided in the first and second power supply electrodes, respectively, a second electrode protection tube provided in the ground electrode, and a plurality of connection tubes configured to connect each of the plurality of first electrode protection tubes to the second electrode protection tube so as to communicate with each other.

12 Claims, 3 Drawing Sheets

(56) References Cited

FOREIGN PATENT DOCUMENTS

| | | | |
|---|---|---|---|
| JP | 2010010570 | A | 1/2010 |
| JP | 2015012275 | A | 1/2015 |
| JP | 2020074409 | A | 5/2020 |
| KR | 20090105820 | A | 10/2009 |
| KR | 101145538 | B1 | 5/2012 |
| KR | 102139296 | B1 * | 7/2020 |
| KR | 20210136488 | A | 11/2021 |
| KR | 102354879 | B1 | 2/2022 |
| KR | 20230130930 | A | 9/2023 |
| TW | 201916166 | A | 4/2019 |
| WO | 2021044504 | A1 | 3/2021 |

* cited by examiner

BATCH TYPE SUBSTRATE PROCESSING APPARATUS

CROSS-REFERENCE TO RELATED APPLICATION

This application claims priority to Korean Patent Application No. 10-2022-0017524 filed on Feb. 10, 2022 and all the benefits accruing therefrom under 35 U.S.C. § 119, the contents of which are incorporated by reference in their entirety.

BACKGROUND

The present disclosure relates to a batch type substrate processing apparatus, and more particularly, to a batch type substrate processing apparatus that generates plasma by a plurality of electrodes to perform a processing process on a substrate.

In general, a substrate processing apparatus that locates a substrate to be processed within a processing space to deposit reaction particles contained in a process gas injected into the processing space by using chemical vapor deposition (CVD) or atomic layer deposition (ALD). The substrate processing apparatus is classified into a single wafer type substrate processing apparatus, which is capable of performing a processing process on one substrate, and a batch type substrate processing apparatus, which is capable of performing a processing process on a plurality of substrates at the same time.

The batch type substrate processing apparatus may supply high-frequency power to a plurality of electrodes to generate plasma and thus supplies radicals, which are obtained by exciting a process gas injected around a plurality of electrodes, to a substrate to perform a processing process. Here, the plurality of electrodes may be damaged while ions generated by the plasma are accelerated toward the plurality of electrodes to collide with the plurality of electrodes.

In addition, while high-frequency power may be supplied to the plurality of electrodes to generate plasma, and thus, heat is generated in the plurality of electrodes. As a temperature of the plurality of electrodes increases due to the heat generation, resistance of the plurality of electrodes increases, so that a voltage of the plurality of electrodes increases, and thus, energy of ions generated by the plasma increases. In addition, the plurality of electrodes may be further damaged while ions having high energy strongly collide with the plurality of electrodes. Particularly, when a processing space is heated by a hot wall type heating unit (or heater) surrounding the processing space, a temperature of the plurality of electrodes further increases, which becomes more problematic issue.

Thus, there is a demand for a configuration capable of lowering the ambient temperature of a plurality of electrodes while preventing damage to the plurality of electrodes.
[Prior Art Document]
[Patent Document]
  Korean Patent No. 10-1145538

SUMMARY

The present disclosure provides a batch type substrate processing apparatus that protects a plurality of electrodes for plasma formation through an electrode protection part.

In accordance with an exemplary embodiment, a batch type substrate processing apparatus includes: a reaction tube having a processing space in which a plurality of substrates are accommodated; a plurality of electrodes extending along a longitudinal direction of the reaction tube and disposed to be spaced apart from each other; and an electrode protection part configured to protect the plurality of electrodes, wherein the plurality of electrodes includes: first and second power supply electrodes spaced apart from each other; and a ground electrode provided between the first power supply electrode and the second power supply electrode, wherein the electrode protection part includes: a plurality of first electrode protection tubes provided in the first and second power supply electrodes, respectively; a second electrode protection tube provided in the ground electrode; and a plurality of connection tubes configured to connect each of the plurality of first electrode protection tubes to the second electrode protection tube so as to communicate with each other.

The plurality of electrodes may generate capacitively coupled plasma (CCP) in a spaced space between the first power supply electrode and the ground electrode and a spaced space between the second power supply electrode and the ground electrode.

The batch type substrate processing apparatus may further include: a cooling gas supply part configured to supply a cooling gas into the plurality of first electrode protection tubes and the second electrode protection tube; and a cooling gas discharge part configured to discharge the cooling gas from the plurality of first electrode protection tubes and the second electrode protection tube so as to generate a flow of the cooling gas.

The cooling gas supply part may be connected to the second electrode protection tube, and the cooling gas discharge part may be connected to each of the plurality of first electrode protection tubes.

The cooling gas discharge part may include an exhaust line connected to each of the plurality of first electrode protection tubes.

The cooling gas discharge part may further include a diameter adjusting member configured to adjust an inner diameter of the exhaust line.

The exhaust line may include: a first exhaust line connected to a pumping port; and a second exhaust line branched with the first exhaust line, wherein the cooling gas discharge part further may include: a first valve provided in the first exhaust line; and a second valve provided in the second exhaust line.

The first valve may be opened when power is supplied to the first and second power supply electrodes, and the second valve may be opened when power is not supplied to the first and second power supply electrodes.

The exhaust line may have an exhaust pressure of approximately 0.15 mbar or more per 1 slm of a flow rate of the cooling gas.

Each of the plurality of connection tubes may have an inner diameter less than that of each of the plurality of first electrode protection tubes and the second electrode protection tube.

The cooling gas may include an inert gas.

The cooling gas supply part may be configured to supply the cooling gas so that a flow rate of the cooling gas when power is not supplied to the first and second power supply electrodes is less than that of the cooling gas when power is supplied to the first and second power supply electrodes.

A flow rate of the cooling gas in each of the first electrode protection tubes may be less than that of the cooling gas in the second electrode protection tube.

The batch type substrate processing apparatus may further include: a plurality of sealing caps which are connected to the plurality of first electrode protection tubes, respectively, and in which an exhaust port, through which the cooling gas is discharged, is provided in a sidewall of an inner space communicating with each of the first electrode protection tubes; and a second sealing cap which is connected to the second electrode protection tube and in which an inlet, through which the cooling gas is supplied, is provided in a sidewall of an inner space communicating with the second electrode protection tube.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Figure 1:
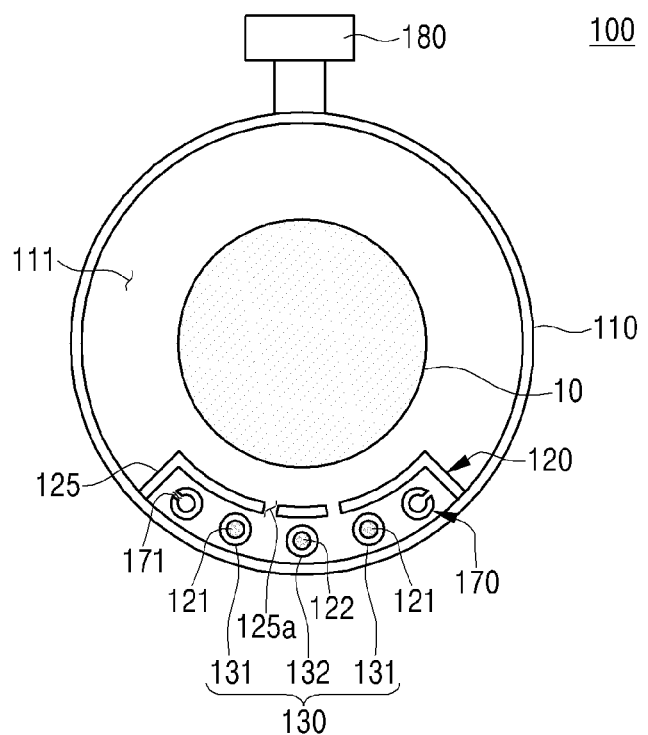
FIG. 1 is a cross-sectional view of a batch type substrate processing apparatus in accordance with an exemplary embodiment.

Hereinafter, specific embodiments will be described in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the descriptions, the same elements are denoted with the same reference numerals. In the figures, the dimensions of layers and regions are exaggerated for clarity of illustration. Like reference numerals refer to like elements throughout.

FIG. 1 is a cross-sectional view of a batch type substrate processing apparatus in accordance with an exemplary embodiment.

Referring to FIG. 1, a batch type substrate processing apparatus 100 in accordance with an exemplary embodiment may include a reaction tube 110 having a processing space 111, in which a plurality of substrates 10 are accommodated, a plurality of electrodes 121 and 122 extending in a longitudinal direction of the reaction tube 110 and spaced apart from each other, and an electrode protection part 130 that protects the plurality of electrodes 121 and 122.

The reaction tube 110 may have a cylindrical shape with a closed upper portion and an opened lower portion, made of a heat resistance material such as quartz or ceramic, and may provide the processing space 111 in which the plurality of substrates 10 are accommodated to be processed. The processing space of the reaction tube 110 may be a space in which the substrate boat, on which the plurality of substrates 10 are loaded in the longitudinal direction of the reaction tube 110, are accommodated, and also, an actual processing process (for example, a deposition process) is performed.

Here, the substrate boat may be configured to support the substrates 10 and be provided so that the plurality of substrates 10 are loaded in the longitudinal direction (i.e., a vertical direction) of the reaction tube 110 and also provide a plurality of processing spaces in which the plurality of substrates 10 are individually processed.

The plurality of electrodes 121 and 122 may extend along the longitudinal direction of the reaction tube 110 and may be spaced apart from each other. For example, each of the plurality of electrodes 121 and 122 may have a bar shape extending along the longitudinal direction of the reaction tube 110, may be arranged side by side (or parallel to each other), and may be spaced apart from each other along a circumferential direction of the reaction tube 110.

Here, the plurality of electrodes 121 and 122 may include first and second power supply electrodes 121a and 121b spaced apart from each other, and a ground electrode 122 provided between the first power supply electrode 121a and the second power supply electrode 121b. The first and second power supply electrodes 121a and 121b may be spaced apart from each other, and high-frequency power (or RF power) may be supplied (or applied) to each of the first and second power supply electrodes 121a and 121b.

The ground electrode 122 may be provided between the first power supply electrode 121a and the second power supply electrode 121b and may be grounded. Here, the ground electrode 122 may be used as a common ground electrode 122 for the first and second power supply electrodes 121a and 121b.

When the high-frequency power source (or high-frequency power) is supplied to the first and second power supply electrodes 121a and 121b, plasma may be generated between the first power supply electrode 121a and the ground electrode 122 and between the second power supply electrode 121b and the ground electrode 122. That is, the first and second power supply electrodes 121a and 121b and the ground electrode 122 may have a three-electrode structure, and the high-frequency power may be divided to be supplied to each of the first and second power supply electrodes 121a and 121b. Thus, the high-frequency power required for generating the plasma or the high-frequency power for obtaining a desired amount of radicals may be reduced, and damage of the first and second power supply electrodes 121a and 121b and the ground electrode 122 and/or generation of particles due to the high-frequency power may be prevented from occurring.

For example, the plurality of electrodes 121 and 122 may be disposed in a discharge space separated from the processing space 111 by a partition wall 125, and a plasma formation part 120 may be provided by the plurality of electrodes 121 and 122 and the partition wall 125. The plasma formation part 120 may generate plasma using the plurality of electrodes 121 and 122 and may decompose the process gas supplied from the gas supply tube 170 by the plasma to provide the decomposed process gas to the processing space 111 in the reaction tube 110. Here, the plasma formation part 120 may have the discharge space separated from the processing space 111 by the partition wall 125 extending in the longitudinal direction of the reaction tube 110. Here, the plasma formation part 120 may extend along the longitudinal direction of the reaction tube 110 to form plasma in the discharge space by the plurality of electrodes 121 and 122 disposed in the circumferential direction of the reaction tube 110.

The discharge space of the plasma formation part 120 may be a space in which the plasma is generated and may be separated from the processing space 111 by the partition wall 125. Thus, the plasma formation part 120 may decompose the process gas supplied from the gas supply tube 170 using the plasma in the discharge space and may provide only radicals of the decomposed process gas into the processing space 111.

Here, the partition wall 125 may extend in the longitudinal direction of the reaction tube 110, be disposed inside the reaction tube 110, or be disposed outside the reaction tube 110. For example, the partition wall 125 may be disposed inside the reaction tube 110 to define the discharge space together with an inner wall of the reaction tube 110 as illustrated in FIG. 1, and may include a plurality of sub sidewalls connected to the inner wall (or inner surface) of the reaction tube 110 and a main sidewall between the plurality of sub sidewalls. The plurality of sub sidewalls may protrude (or extend) from the inner wall of the reaction tube 110 to the inside of the reaction tube 110 and may be spaced apart from each other to be disposed in parallel. In addition, the main sidewall may be spaced apart from the inner wall of the reaction tube 110 and disposed between the plurality of sub sidewalls. Here, all the plurality of sub sidewalls and the main sidewall may extend along the inner wall of the reaction tube 110 in the longitudinal direction of the reaction tube 110. However, the partition wall 125 may be provided in various shapes without being limited to the shape illustrated in FIG. 1 as long as the partition wall provides the discharge space that is separated from the processing process.

As another embodiment, the partition wall 125 may be disposed outside the reaction tube 110 to define the discharge space 125 together with an outer wall of the reaction tube 110 and may include the plurality of sub sidewalls connected to an outer surface (or outer wall) of the reaction tube 110 and the main sidewall between the plurality of sub sidewalls. The plurality of side sidewalls 115a and 115b may protrude from the outer wall of the reaction tube 110 to the outside of the reaction tube 110 and may be disposed to be spaced apart from each other and parallel to each other. In addition, the main sidewall may be spaced apart from the outer wall of the reaction tube 110 and disposed between the plurality of sub sidewalls.

The main sidewall may be provided in the form of a tube having a diameter less or greater than that of the reaction tube 110 to define the discharge space between the sidewall of the reaction tube 110 and the main sidewall (i.e., between the inner wall of the reaction tube and the main sidewall or between the outer wall of the reaction tube and the main sidewall).

The plasma formation part 120 may generate the plasma in the discharge space separated from the processing space 111 by the partition wall 125 so that the process gas supplied from the gas supply tube 170 is not directly supplied into the reaction tube 110 to be decomposed in the processing space 111, but is decomposed in the discharge space that is a space separated from the processing space 111 and then supplied into the processing space 111. The inner wall (or an inside wall) of the processing space 111 as well as the substrate 10 may increase in temperature by a hot wall type heating unit (or heater) surrounding the processing space 111, and thus, the process gas may be deposited to form an undesired thin film on the inner wall of the processing process 111. The thin film formed (or deposited) on the inner wall of the processing space 111 may act as a contaminant during the processing process of the substrate 10 while being separated as particles by an electric field or a magnetic field caused by the plasma. Thus, when the plasma formation part 120 generates the plasma in the discharge space that is separated from the processing space 111 through the partition wall 125 to directly supply the process gas into the processing space 111, thereby generating the plasma in the processing space 111, a limitation in which the thin film formed on the inner wall of the processing space 111 is separated as the particles by the electric field and magnetic field, may be prevented from occurring.

The electrode protection part 130 may protect the plurality of electrodes 121 and 122 and may surround at least a portion of each of the plurality of electrodes 121 and 122 to protect each of the plurality of electrodes 121 and 122. For example, the electrode protection part 130 may surround at least a portion of each of the first and second power supply electrodes 121a and 121b and the ground electrode 122 to protect the first and second power supply electrodes 121a and 121b and the ground electrode 122.

Figure 2:
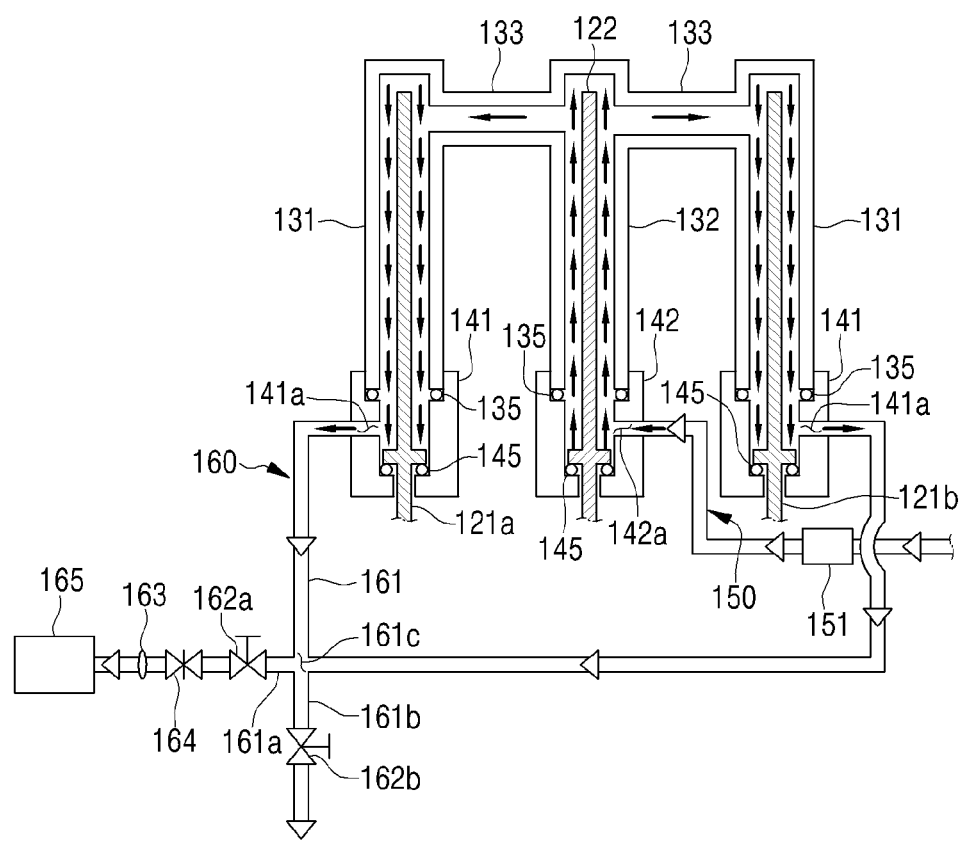
FIG. 2 is a conceptual view for explaining a flow of a cooling gas of an electrode protection part in accordance with an exemplary embodiment.

FIG. 2 is a conceptual view for explaining a flow of a cooling gas of the electrode protection part in accordance with an exemplary embodiment.

Referring to FIG. 2, the electrode protection part 130 may include a plurality of first electrode protection tubes 131, which are respectively provided in the first and second power supply electrodes 121a and 121b, a second electrode protection tube 132 provided in the ground electrode 122, and a plurality of connection tubes 133 connecting each of the plurality of first electrode protection tubes 131 to the second electrode protection tube 132 to communicate with each other. The plurality of first electrode protection tubes 131 may be provided in the first and second power supply electrodes 121a and 121b, respectively, and surround an outer circumferential surface of each of the first and second power supply electrodes 121a and 121b to protect the first and second power supply electrodes 121a and 121b.

The second electrode protection tube 132 may be provided in the ground electrode 122 and may surround an outer circumferential surface of the ground electrode 122 to protect the ground electrode 122.

For example, each of the first and second power supply electrodes 121a and 121b and the ground electrode 122 may be protected to be surrounded by the first electrode protection tube 131 and/or the second electrode protection tube 132 from the top to the bottom, each of the plurality of power supply electrodes 121a and 121b and the ground electrode 122 may be made of a flexible braided wire.

In general, electrical conduction due to the use of a high-frequency power source may cause a skin effect in which current flows along a surface (or may be affected by a depth of penetration of metal, which is a depth through which current flows). In addition, in the case of using a mesh type electrode for the first and second power supply electrodes 121a and 121b and the ground electrode 122, since an area occupied by an empty space is large, and thus, there is a limitation of inefficiency in supplying the high-frequency power by large resistance due to the large surface area. Furthermore, the processing process for the substrate 10 may be repeatedly performed at high and low temperatures, and when the first and second power supply electrodes 121a and 121b and the ground electrode 122 are provided in the mesh type, the shape of the mesh electrode may be irregularly changed according to the temperature, which is disadvantageous in terms of maintaining the shape. In addition, there is a limitation in that nonuniform plasma is generated when high-frequency power is supplied because resistance varies in accordance with the changed shape.

In order to prevent these limitations, the first and second power supply electrodes 121a and 121b and the ground electrode 122 may be not only inserted into the first electrode protection tube 131 and/or the second electrode protection tube 132, but also minimize the empty space, and thus be provided in the braided type (braided wire) having flexibility. For example, in order to further reduce the empty space, a method of applying a metal on the surface of each of the electrodes may be additionally performed. In addition, a spring part (not shown) that fixes and supports both ends of each of the first and second power supply electrodes 121a and 121b and the ground electrode 122 so as not to move may be further provided so that the flexible braided type first and second power supply electrodes 121a and 121b and the ground electrode 122 extend in the longitudinal direction of the reaction tube 110 inside the discharge space and then are maintained in a fixed state. As a result, each of the first and second power supply electrodes 121a and 121b and the ground electrode 122, which are flexible, may be fixed in the longitudinal direction of the reaction tube 110 by the spring part and then maintained in a thin and elongated rod shape.

The first electrode protection tube 131 and the second electrode protection tube 132 may surround the outside of the first and second power supply electrodes 121a and 121b and the outside of the ground electrode 122, respectively, to electrically insulate each of the first and second power supply electrodes 121a and 121b and the ground electrode 122 and also protect the first and second power supply electrodes 121a and 121b and the ground electrode 122, which are exposed to the plasma atmosphere, from the plasma. In addition, the first and second power supply electrodes 121a and 121b and the ground electrode 122 may be safely protected from the contamination or particles that may be generated by the plasma. Here, each of the first electrode protection tube 131 and the second electrode protection tube 132 may be made of a heat-resistant material such as quartz or ceramic and may be manufactured to be integrated with the reaction tube 110.

The plurality of connection tubes 133 may connect each of the plurality of first electrode protection tubes 131 to the second electrode protection tube 132 and may allow the plurality of first electrode protection tubes 131 and the second electrode protection tube 132 to communicate with each other. Here, the plurality of connection tubes 133 may maintain an interval between each of the plurality of first electrode protection tubes 131 and the second electrode protection tube 132. Thus, the interval between the first power supply electrode 121a and the ground electrode 122 and the interval between the first power supply electrode 121a and the ground electrode 122 may be maintained uniformly (or constantly), and also, the interval between each of the first and second power supply electrodes 121a and 121b and the ground electrode 122 may be uniformly spaced apart from each other.

In order to obtain a uniform plasma density in the discharge space, the spaced space (or plasma generation space) between the first power supply electrode 121a and the ground electrode 122 and the spaced space between the second power supply electrode 121b and the ground electrode 122 have to have the same volume (or area). In addition, it is necessary that the plasma (or plasma potential) having the same intensity is generated in the spaced space between the first power supply electrode 121a and the ground electrode 122 and the spaced space between the second power supply electrode 121b and the ground electrode 122 to generate a uniform plasma density in the spaced space between the first power supply electrode 121a and the ground electrode 122 and the spaced space between the second power supply electrode 121b and the ground electrode 122. For this, each of the plurality of first electrode protection tubes 131 may be connected to the second electrode protection tube 132 to maintain the interval between each of the plurality of first electrode protection tubes 131 may be connected to the second electrode protection tube 132. Thus, the interval between the first power supply electrode 121a and the ground electrode 122 and the interval between the first power supply electrode 121a and the ground electrode 122 may be maintained to be the same. Thus, the interval between the first power supply electrode 121a and the ground electrode 122 and the interval between the first power supply electrode 121a and the ground electrode 122 have the same volume, so that the plasma density is uniform in a plurality of plasma generation spaces (or the spaced spaces).

In addition, the plurality of connection tubes 133 may connect the plurality of first electrode protection tubes 131 to the second electrode protection tube 132 as well as allow the first electrode protection tubes 131 and the second electrode protection tube 132 to communicate with each other so that a gas flows between the first electrode protection tubes 131 and the second electrode protection tube 132. For example, a gas passage, in which the inner walls (or inner surfaces) of the plurality of first electrode protection tubes 131 and the second electrode protection tube 132 are respectively spaced apart from the first and second power supply electrodes 121a and 121b and the ground electrode 122 (or from surfaces of the first and second power supply electrodes and the ground electrode) so that a gas flows, may be provided in each of the plurality of first electrode protrusion tubes 131 and the second electrode protection tube 132. In addition, a gas passage having a tube shape may be provided in each of the plurality of connection tubes 133 to allow the gas passage of each of the plurality of first electrode protection tubes 131 and the gas passage of the second electrode protection tube 131 to communicate with each other.

Here, the plurality of electrodes 121 and 122 may generate capacitively coupled plasma (CCP) in the spaced space between the first power supply electrode 121a and the ground electrode 122 and the spaced space between the second power supply electrode 121b and the ground electrode 122. The first and second power supply electrodes 121a and 121b may be spaced apart from the ground electrode 122 to define the plurality of plasma generation spaces. That is, the spaced space between the first power supply electrode 121a and the ground electrode 122 and the spaced space between the second power supply electrode 121b and the ground electrode 122 may provide the plurality of plasma generation spaces.

In addition, the plurality of electrodes 121 and 122 may generate the capacitively coupled plasma (CCP) in the spaced space (plasma generation space) between the first power supply electrode 121a and the ground electrode 122 and the spaced space (plasma generation space) between the second power supply electrode 121b and the ground electrode 122. For example, as the high-frequency power is supplied to each of the first and second power supply electrodes 121a and 121b, the capacitively coupled plasma (CCP) may be generated by an electric field generated in the spaced space between the first power supply electrode 121a and the ground electrode 122 and the spaced space between the second power supply electrode 121b and the ground electrode 122.

Unlike the capacitively coupled plasma (CCP) method in which energy is obtained through electron acceleration generated by the electric field generated in the spaced space between the first power supply electrode 121a and the ground electrode 122 and the spaced space between the second power supply electrode 121b and the ground electrode 122 to generate the plasma, in the inductively coupled plasma (ICP) method, when a magnetic field generated by current flowing through antennas connected to each other is changed over time, plasma may be generated from the electric field generated around the magnetic field. In general, in the inductively coupled plasma (ICP) method, the plasma is generated by E-mode and converted to H-mode to generate high-density plasma. The inductively coupled plasma (ICP) method is divided into the E-mode and the H-mode according to plasma density or applied power. In order to perform the mode conversion from the E-mode with low plasma density to the H-mode with high plasma density, high power has to be induced. Here, when input power increases, a number of radicals that do not participate in the reaction in accordance with particles and a high electron temperature are generated to cause limitations, in which it difficult to obtain a good quality film, and it is difficult to generate uniform plasma in accordance with the electric fields generated by the antenna.

However, in the present disclosure, since the capacitively coupled plasma (CCP) is generated in each of the paced space between the first power supply electrode 121a and the ground electrode 122 and the spaced space between the second power supply electrode 121b and the ground electrode 122, it is unnecessary to induce high power for performing the mode conversion as in the inductively coupled plasma (ICP). As a result, it is more effective in preventing the generation of the particles and obtaining the good quality film by generating a large number of radicals participating in the reaction in accordance with the low electron temperature.

The batch type substrate processing apparatus 100 in accordance with an exemplary embodiment may further include a cooling gas supply part 150 that supplies a cooling gas into the plurality of first electrode protection tubes 131 and the second electrode protection tube 132, and a cooling gas discharge part 160 that discharges the cooling gas from the plurality of first electrode protection tubes 131 and the second electrode protection tube 132 to generate a flow of the cooling gas.

The cooling gas supply part 150 may supply the cooling gas to the plurality of first electrode protection tubes 131 and the second electrode protection tube 132 to cool the first and second power supply electrodes 121a and 121b and the ground electrode 122, which are disposed in the plurality of first electrode protection tubes 131 and the second electrode protection tube 132, respectively. Heat may be generated while the plasma is generated by supplying the high-frequency power to the first and second power supply electrodes 121a and 121b. Due to the increase in temperature of the first and second power supply electrodes 121a and 121b and the ground electrode 122 by the heat generation, (metal) resistance of the first and second power supply electrodes 121a and 121b and the ground electrode 122 may increase, and thus, a (induced) voltage may increase by the following formula: voltage (V)=current (I)×resistance (R) to increase in energy of ions generated by the plasma. In addition, the ions having high energy may strongly collide with the surfaces of the plurality of first electrode protection tubes 131 and/or the second electrode protection tube 132 to cause damage of the plurality of first electrode protection tubes 131 and the second electrode protection tube 132 and/or generate particles such as metal components contained in a material that forms the first electrode protection tube 131 and the second electrode protection tube 132, such as quartz. The Particles generated as described above may act as contaminants in the reaction tube 110 to cause (metal) contamination of the thin film. For example, the contaminant particles (or particles) generated during a process of manufacturing a semiconductor device are very closely related to yield of the device, and in particular, the (metal) contamination particles generated during the thin film process conduct current to cause current leakage. Due to the current leakage, a malfunction of the device may be caused, and a fatal adverse effect may be exerted on the yield of the product.

Therefore, in the present disclosure, the cooling gas may be supplied into the plurality of first electrode protection tubes 131 and the second electrode protection tube 132 through the cooling gas supply part 150 to cool the first and second power supply electrodes 121a and 121b and the ground electrode 122, thereby preventing or suppressing the increase in temperature of each of the first and second power supply electrodes 121a and 121b and the ground electrode 122. Thus, the energy of the ions generated by the plasma may be prevented from increasing, and the plurality of first electrode protection tubes 131 and/or the second electrode protection tubes 132 may be prevented from colliding with each other on the surfaces of the plurality of electrode protrusion tubes 131 and/or the second electrode protection tube 132 due to the high level energy of the ions to exclude the effect of the (metal) contamination.

In addition, the process of processing the substrate 10 may be performed at a high temperature of approximately 600° C. or more, and the first and second power supply electrodes 121a and 121b and the ground electrode 122 made of a metal such as nickel (Ni) may be oxidized at a high temperature of approximately 600° C. or more. Thus, the cooling gas may be supplied as a protective gas into the plurality of first electrode protection tubes 131 and the second electrode protection tube 132 through the cooling gas supply part 150 to prevent the first and second power supply electrodes 121a and 121b and the ground electrode 122 from being oxidized. In addition, a lifespan of each of the first and second power supply electrodes 121a and 121b and the ground electrode 122 may be improved.

For example, the cooling gas may be supplied to the plurality of first electrode protection tubes 131 or second electrode protection tubes 132 and also flow into the other electrode protection tube 131 or 132 via the connection tube 133 (or through the connection tube). Here, the cooling gas supply part 150 may include a flowmeter 151 that measures a flow rate (or supply amount) of the cooling gas. Thus, the flow rate of the cooling gas may be measured through the flowmeter 151 to adjust the supply amount (or flow rate) of the cooling gas.

The cooling gas discharge part 160 may discharge the cooling gas from the plurality of first electrode protection tubes 131 and the second electrode protection tube 132 to generate a flow of the cooling gas. For example, the cooling gas supply part 150 may be connected to the plurality of first electrode protection tubes 131 or the second electrode protection tube 132. In addition, the cooling gas discharge part 160 may be connected to the remaining electrode protection tube 131 or 132, to which the cooling gas supply part 150 is not connected, among the plurality of first electrode protection tubes 131 and the second electrode protection tube 132 to discharge the cooling gas supplied to the first electrode protection tubes 131 or the second electrode protection tube 132. As a result, the cooling gas supplied to the plurality of first electrode protection tubes 131 or the second electrode protection tube 132 to flow to the remaining electrode protection tube 131 or 132 through the connection tube 133 may be discharged.

In the present disclosure, a passage of the cooling gas, which passes through the plurality of first electrode protection tubes 131 or the second electrode protection tubes 132, the connection tube 133, and the remaining electrode protrusion tube 131 or 132 may be provided through the cooling gas supply part 150, the connection tube 133, and the cooling gas discharge part 160. Thus, the cooling gas may effectively flow through the plurality of first electrode protection tubes 131 and the second electrode protection tube 132 to effectively cool the first and second power supply electrodes 121a and 121b and the ground electrode 122 and effectively prevent the first and second power supply electrodes 121a and 121b and the ground electrode 122 from being oxidized.

Here, the plurality of connection tubes 133 may connect one end (e.g., upper end) of each of the first electrode protection tubes 131 to one end of the second electrode protection tube 132.

Figure 3:
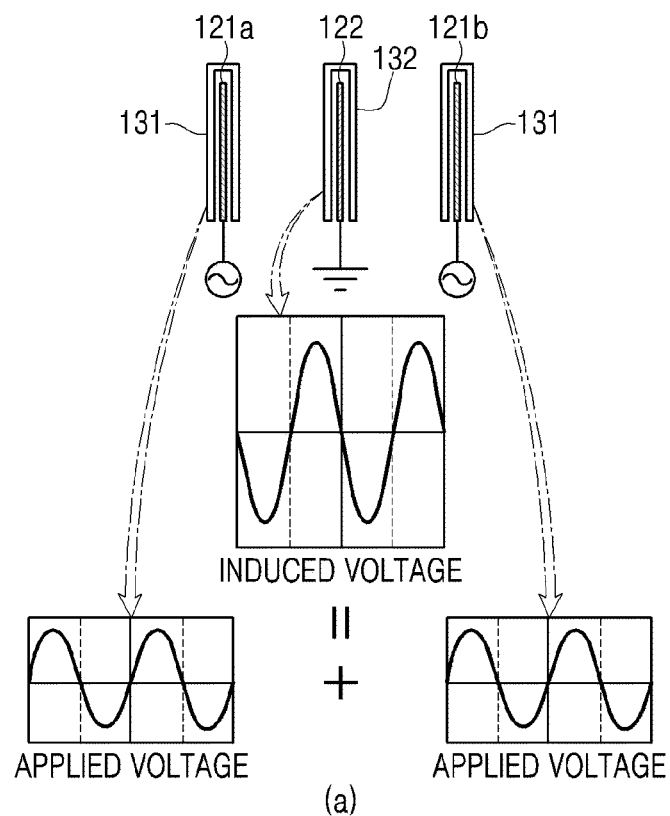
FIG. 3 is a conceptual view for explaining voltage waveforms and electric fields of first and second power supply electrodes and a ground electrode in accordance with an exemplary embodiment.
Figure 3:
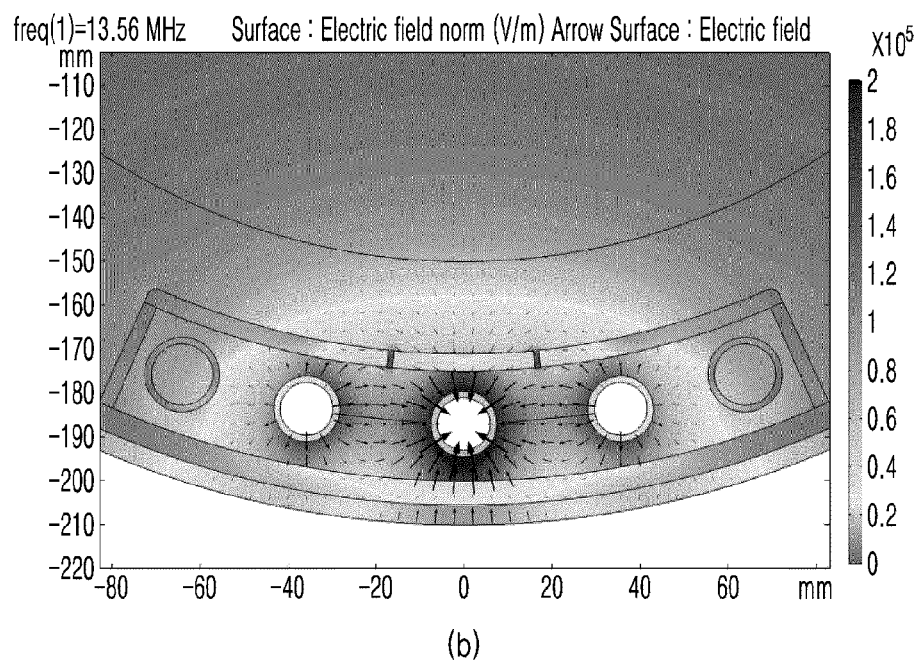

FIG. 3 is a conceptual view for explaining voltage waveforms and electric fields of the first and second power supply electrodes and the ground electrode in accordance with an exemplary embodiment. Here, (a) of FIG. 3 illustrates voltage waveforms of the first and second power supply electrodes and the ground electrode, and (b) of FIG. 3 illustrates electric fields of the first and second power supply electrodes and the ground electrode.

Referring to FIG. 3, voltages applied to the first and second power supply electrodes 121a and 121b may be synthesized (or merged) to induce a high induced voltage (e.g., twice the voltage) to the ground electrode 122, and also, high-temperature heat, which is higher than that of the first and second power supply electrodes 121a and 121b) may be generated due to overlapping of electric fields. That is, the common ground electrode 122 may be affected by both the first power supply electrode 121a and the second power supply electrode so that the electric fields overlap each other, and as a result, the high-temperature heat may be generated in the ground electrode 122.

In detail, in the three-electrode structure using the common ground electrode 122, the voltage applied to the first power supply electrode 121a and the voltage applied to the second power supply electrode 121b have the same phase difference, and thus, electric fields greater than those of the first and second power supply electrodes 121a and 122b may be induced to the ground electrode 122. Thus, due to the undesired the high electric field, the plasma potential increases in proportion to the electric field. When the plasma potential of the ground electrode 122 increases in this manner, the high-temperature heat of the ground electrode 122 may be generated to case plasma damage. In addition, the plasma damage may occur to cause damage in the second electrode protrusion tube 132 around the ground electrode 122, the partition wall 125, and the reaction tube 110 as well as the ground electrode 122 to which the double voltage is induced.

Thus, effective cooling of the ground electrode 122, which generates the high-temperature heat, is required.

For the effective cooling of the ground electrode 122, the cooling gas supply part 150 may be connected to the second electrode protection tube 132, and the cooling gas discharge part 160 may be connected to the plurality of first electrode protection tubes 131. The cooling gas supply part 150 may be connected to the second electrode protection tube 132 to first supply the cold cooling gas to the second electrode protection tube 132 in which the ground electrode 122 is disposed (or inserted), thereby effectively cooling the ground electrode 122 in which the high-temperature heat is generated to the cooling gas that is in a cold state because of passing through the other electrode protection tube (i.e., the first electrode protrusion tube). That is, the cooling gas may be in contact with the ground electrode 122 in which the high-temperature heat is generated in the cold state to cause a large temperature difference between the cooling gas and the ground electrode 122 so that heat-exchange is actively performed between the cooling gas and the ground electrode 122. Thus, the ground electrode 122 that generates the high-temperature heat may be effectively cooled.

On the other hand, when the cooling gas supply part 150 is connected to at least one of the plurality of first electrode protection tubes 131 to supply the cooling gas from at least one of the plurality of first electrode protection tubes 131, the cooling gas may be heat-exchanged with the first power supply electrode 121a and the second power supply electrode 121b while passing through at least one of the plurality of first electrode protrusion tubes 131. As a result, a temperature difference between the heated cooling gas and the ground electrode 122 becomes insignificant (or reduced), and the cooling of the ground electrode 122 that generates the high-temperature heat may be insignificant (or ineffective).

The cooling gas discharge part 160 may be connected to each of the plurality of first electrode protection tubes 131. Thus, the cooling gas supplied to the second electrode protection tube 132 to cool the ground electrode 122 may be moved (or introduced) to each of the first electrode protection tubes 131 through the (plurality of) connection tubes 133, and after cooling the first power supply electrode 121a and the second power supply electrode 121b with the cooling gas introduced into the plurality of first electrode protection tubes 131, the cooling gas may be discharged. Thus, a flow of the cooling gas, in which the cooling gas is supplied to the second electrode protection tube 132 through the cooling gas supply part 150 to pass through each of the connection tubes 133 and then pass through each of the first electrode protection tubes 131, and then may be discharged to the cooling gas discharge part 160, may occur. In addition, two flows of the cooling gas branched (or distributed) from the second electrode protection tube 132 to the first electrode protection tubes 131 disposed at both sides based on the second electrode protection tube 132 may be generated.

Here, the cooling gas supplied to the second electrode protection tube 132 may be distributed to move to the plurality of first electrode protection tubes 131 through the plurality of connection tubes 133 after cooling the ground electrode 122 that generates the high-temperature heat. Therefore, even if heated by the heat-exchange with the ground electrode 122, the cooling gas may have a temperature less than that of each of the first and second power supply electrodes 121a and 121b, and thus, the first and second power supply electrodes 121a and 121b may be cooled. Here, heat (having a temperature less than that of the ground electrode 122) may be generated in the first and second power supply electrodes 121a and 121b, and as a result, even the cooling gas heated by the heat-exchange with the ground electrode 122 may also sufficient cool the first and second power supply electrodes 121a and 121b.

When the cooling gas is supplied to the second electrode protection tube 132 and then distributed to the plurality of first electrode protection tubes 131 through the plurality of connection tubes 133 to generate the two flows of the cooling gas, the two flows of the cooling gas may be smooth without interfering with each other. On the other hand, when the cooling gas is supplied to the plurality of first electrode protection tubes 131, and then, the cooling gas is discharged to the second electrode protection tube 132, the cooling gas supplied to the plurality of first electrode protection tubes 131 may be joined (or merged) into one second electrode protection tube 132 through the plurality of connection tubes 133 to cause a bottleneck and/or a vortex. As a result, the flow of the cooling gas is not smooth, and the cooling of the first and second power supply electrodes 121a and 121b and/or the ground electrode 122 may not be effective. That is, since the cooling gas is merged from the plurality of first electrode protection tubes 131 into one second electrode protection tube 132, the two flows of the cooling gas may interfere with each other, and thus, the flow of the cooling gas may not smooth.

Here, the cooling gas discharge part 160 may include exhaust lines 161 respectively connected to the plurality of first electrode protection tubes 131. The exhaust line 161 may be connected to each of the plurality of first electrode protection tubes 131. Thus, the cooling gas may be supplied to the second electrode protection tube 132 to cool the ground electrode 122 and be distributed to the plurality of first electrode protection tubes 131 through the plurality of connection tubes 133 to move so that the cooling gas cools the first power supply electrode 121a or the second power supply electrode 121b and then is discharged. Here, the exhaust line 161 may be connected to each of the plurality of first electrode protection tubes 131, and thus, an amount of cooling gas at a position (e.g., an exhaust port) is greater than that at a position (e.g., an inlet), i.e., the exhaust port is widened than the inlet so that the cooling gas is smoothly discharged. In addition, the flow of the cooling gas may be made smooth in accordance with the supply of the cooling gas.

In addition, the exhaust line 161 may include a first exhaust line 161a connected to a pumping port, and a second exhaust line 161b branched with the first exhaust line 161a. The first exhaust line 161a may be connected to the pumping port to generate an exhaust pressure (or a pressure for the exhaust) in at least a portion (e.g., the first exhaust line) of the exhaust line 161, and thus, the cooling gas may be smoothly discharged from the plurality of first electrode protection tubes 131.

For example, the first exhaust line 161a may be connected to a vacuum pump 165 connected to the pumping port to quickly discharge the cooling gas that is heated by the heat-exchange with the ground electrode 122 and the first power supply electrode 121a or the second power supply electrode 121b. As a result, the ground electrode 122 and the first and second power supply electrodes 121a and 121b may be rapidly cooled to improve cooling efficiency of the ground electrode 122 and the first and second power supply electrodes 121a and 121b.

The second exhaust line 161b may be branched with the first exhaust line 161a to exhaust the cooling gas to the atmosphere without generating an artificial exhaust pressure through the vacuum pump 165 or the like.

Here, a flow rate of the cooling gas in each of the first electrode protection tubes 131 may be less than the flow rate of the cooling gas in the second electrode protection tube 132, and thus, the cooling gas may be effectively discharged even when the cooling gas is discharged at the same time from the plurality of first electrode protection tubes 131 through one vacuum pump 165. In addition, since an internal pressure of each of the first electrode protection tubes 131 is less than that of the second electrode protection tube 132, the cooling gas may effectively flow from the second electrode protection tube 132 to each of the first electrode protection tubes 131.

Here, the cooling gas discharge part 160 may further include a diameter adjusting member 163 for adjusting an inner diameter of the exhaust line 161. The diameter adjusting member 163 may adjust an inner diameter of the exhaust line 161 and may adjust an inner diameter of at least the first exhaust line 161a. Since each of the plurality of first electrode protection tubes 131 and the second electrode protection tube 132 is made of quartz or the like and thus broken by a vacuum pressure (or negative pressure), the inside of each of the plurality of first electrode protection tubes 131 and the second electrode protection tube 132 may be maintained at an appropriate (internal) pressure (e.g., atmospheric pressure level). When the exhaust pressure is generated in the exhaust line 161 through the vacuum pump 165 without the diameter adjusting member 163, a too low (internal) pressure (or vacuum pressure) may be generated in the plurality of first electrode protection tubes 131 and the second electrode protection tube 132, and thus, the plurality of first electrode protection tubes 131 and/or the second electrode protection tubes 132 may be broken. Thus, even if the inner diameter of at least the first exhaust line 161a of the exhaust lines 161 is reduced (or adjusted) through the diameter adjusting member 163 to generate the exhaust pressure in the exhaust line 161 through the vacuum pump 165, the inside of the first electrode protection tube 131 and the second electrode protrusion tube 132 may be maintained at an appropriate (internal) pressure.

For example, the diameter adjusting member 163 may include an orifice, and the orifice may be inserted by the ¼ inch into the first exhaust line 161a so that the cooling gas that cools the ground electrode 122 and the first power supply electrode 121a or the second power supply tube 121b is constantly discharged to the vacuum pump 165. Here, the orifice may be provided as a punched thin plate and may be used for the purpose of pressure drop and flow restriction to help the discharge of the cooling gas at a stable exhaust pressure.

The batch type substrate processing apparatus 100 in accordance with the present disclosure may further include a needle valve 164 installed in the exhaust line 161 to adjust a discharge amount of cooling gas that cools the ground electrode 122 and the first power supply electrode 121a or the second power supply tube 121b. The needle valve 164 may be installed in the exhaust line 161 to finely adjust the flow rate. Here, the needle valve 164 may manually control an ultra-fine flow rate, and thus, the exhaust amount may be adjusted for vacuum exhaust and/or air exhaust (or heat exhaust).

Here, the cooling gas discharge part 160 may further include a first valve 162a provided in the first exhaust line 161a, and a second valve 162b provided in the second exhaust line 161b. The first valve 162a may be provided in the first exhaust line 161a, and when the first valve 162a is opened, the exhaust through the first exhaust line 161a may be performed, and thus, the vacuum exhaust may be performed.

The second valve 162b may be provided in the second exhaust line 161b, and when the second valve 162b is opened, the exhaust through the second exhaust line 161b may be performed, and thus, the atmospheric exhaust may be performed.

For example, the first valve 162a and the second valve 162b may be provided (or installed) behind (or at a rear end) of a joining point 161c between the exhaust line 161 connected to the first electrode protection tube 131, in which the first power supply electrode 121a is disposed, and the exhaust line 161 connected to the first electrode protrusion tube 131, in which the second power supply electrode 12b is disposed. Here, the vacuum exhaust and the atmospheric exhaust may be diverged at the joining point 161*c* in accordance with the opening and closing of each of the first valve 162*a* and the second valve 162*b*.

Here, the first valve 162*a* may be opened when the power is supplied to the first and second power supply electrodes 121*a* and 121*b*, and the second valve 162*b* may be opened when the power is not supplied to the first and second power supply electrodes 121*a* and 121*b*. That is, when (high-frequency) power is supplied to the first and second power supply electrodes 121*a* and 121*b* to generate the plasma, the first and second power supply electrodes 121*a* and 121*b* and the ground electrode 122 may generate heat. Thus, the first valve 162*a* may be opened to rapidly cool the ground electrode 122 and the first and second power supply electrodes 121*a* and 121*b* through the generation of the exhaust pressure of the exhaust line 161, thereby improving the cooling efficiency of the ground electrode 122 and the first and second power supply electrodes 121*a* and 121*b*. In addition, when the power is not supplied to the first and second power supply electrodes 121*a* and 121*b* because the plasma generation is not required, the second valve 162*b* may be opened to exhaust the cooling gas, which is heated by the heat-exchange with the ground electrode 122 and the first power supply electrode 121*a* or the second power supply tube 121*b*, to the atmosphere. Here, when the first valve 162*a* is opened, the second valve 162*b* may be closed, and when the second valve 162*b* is opened, the first valve 162*a* may be closed.

The exhaust line 161 may generate an exhaust pressure of approximately 0.15 mbar or more per standard liter per minute (slm) of a flow rate of the cooling gas, and specifically, an exhaust pressure of approximately 0.15 to approximately 20 mbar or more per 1 slm of a flow rate of the cooling gas. When the cooling gas is supplied to (only) the second electrode protection tube 132, the cooling gas has to be uniformly distributed to flow through the plurality of first electrode protection tubes 131, and the cooling efficiency of the first and second power supply electrodes 121*a* and 121*b* has to be maintained at the same level. However, due to a sagging (or tilting) phenomenon of the ground electrode 122, the first power supply electrode 121*a* or the second power supply electrode 121*b*, an interval between each electrode 121 or 122 and the electrode protrusion tube 131 or 132 may be non-uniform to disturb the flow of the cooling gas. This may act as a factor in deteriorating the cooling efficiency of the first and second power supply electrodes 121*a* and 121*b* and/or the ground electrode 122.

Thus, the exhaust line 161 may generate an exhaust pressure of approximately 0.15 mbar or more per 1 slm of a flow rate of the cooling gas. In this case, the sagging phenomenon of the ground electrode 122, the first power supply electrode 121*a* or the second power supply electrode 121*b* may be suppressed or prevented to maintain the interval between each electrode 121 or 122 and the electrode protrusion tube 131 or 132 at the same level, and also, even if the interval between each electrode 121 or 122 and the electrode protection tube 131 or 132 is not constant, the cooling gas may be uniformly distributed to flow to the plurality of first electrode protrusion tubes 131. In addition, since the cooling gas at a (almost) constant (or the same level) flow rate may flow through the plurality of first electrode protection tubes 131, the cooling efficiency of the first and second power supply electrodes 121*a* and 121*b* may be equalized.

Here, when an exhaust pressure exceeding approximately 20 mbar per 1 slm of a flow rate of the cooling gas is generated in the exhaust line 161, the cooling gas may flow too fast, and thus, the cooling gas may not be sufficiently heat-exchanged with the ground electrode 122, the first power supply electrode 121*a* and/or the second power supply electrode 121*b*, and rather, the cooling efficiency of the first and second power supply electrodes 121*a* and 121*b* and the ground electrode 122 may be deteriorated.

The exhaust pressure of each of the exhaust line 161 connected to the first electrode protrusion tube 131, in which the first power supply electrode 121*a* is disposed, and the exhaust line 161 connected to the first electrode protrusion tube 131, in which the second power supply electrode 121*b* may be adjusted (controlled).

The exhaust pressure of each of the exhaust line 161 connected to the first electrode protrusion tube 131, in which the first power supply electrode 121*a* is disposed, and the exhaust line 161 connected to the first electrode protrusion tube 131, in which the second power supply electrode 121*b* may be adjusted, and thus, the cooling gas having a (almost) constant flow rate may flow through the plurality of first electrode protection tube 131. Here, a flow rate of each of the plurality of first electrode protection tubes 131 may be measured to adjust the exhaust pressure of each of the exhaust line 161 connected to the first electrode protrusion tube 131, in which the first power supply electrode 121*a* is disposed, and the exhaust line 161 connected to the first electrode protrusion tube 131, in which the second power supply electrode 121*b*. In addition, the exhaust pressure of each of the exhaust line 161 connected to the first electrode protrusion tube 131, in which the first power supply electrode 121*a* is disposed, and the exhaust line 161 connected to the first electrode protrusion tube 131, in which the second power supply electrode 121*b* may be adjusted so that the flow rate of each of the plurality of first electrode protection tubes 131 varies for appropriate cooling in accordance with the temperature of each of the first and second power supply electrodes 121*a* and 121*b*.

Each of the plurality of connection tubes 133 may have an inner diameter less than that of each of the plurality of first electrode protection tubes 131 and the second electrode protection tube 132. When the plurality of connection tubes 133 have the inner diameter less than that of each of the plurality of first electrode protection tubes 131 and the second electrode protection tube 132, after the cooling gas is sufficiently filled in the second electrode protection tube 132, the cooling gas may be distributed into the plurality of first electrode protection tubes 131. Also, since the inside of the second electrode protection tube 132 is sufficiently filled with the cooling gas, the oxidation of the ground electrode 122 may be effectively prevented.

On the other hand, when the plurality of connection tubes 133 have an inner diameter equal to or greater than that of each of the plurality of first electrode protection tubes 131 and the second electrode protection tube 132, before the cooling gas supplied into the second electrode protection tube 132 is (sufficiently) filled in the second electrode protrusion tube 132, the cooling gas may flow out into the plurality of connection tubes 133. Due to this structure, the cooling gas may not be supplied to the entire surface of the ground electrode 122, the first power supply electrode 121*a* and/or the second power supply electrode 121*b*, and thus, the oxidation prevention effect may be reduced. In addition, the cooling efficiency may be deteriorated because there is a portion at which the heat-exchange is not performed, and temperature non-uniformity may occur at each position in the ground electrode 122, the first power supply electrode 121*a* and/or the second power supply electrode 121*b*, and thus, the ground electrode 122, the first power supply electrode 121a and/or the second power supply electrode 121b may be damaged, or the plasma discharge (or generation) performance may be affected.

Therefore, in the present disclosure, these limitations may be solved by making the inner diameter of each of the plurality of connector tubes 133, which is less than the inner diameter of each of the plurality of first electrode protection tubes 131 and the second electrode protection tubes 132.

Here, the cooling gas may include an inert gas, and the inert gas may be nitrogen ($N_2$), argon (Ar), or the like. The inert gas such as nitrogen ($N_2$) may be supplied into the plurality of first electrode protection tubes 131 and the second electrode protection tube 132 to prevent oxygen ($O_2$) from being introduced into or staying in the plurality of first electrode protection tubes 131 and the second electrode protection tube 132. As a result, it is possible to prevent the first and second power supply electrodes 121a and 121b and the ground electrode 122 from being oxidized by reacting with oxygen ($O_2$).

When the power is not supplied to the first and second power supply electrodes 121a and 121b, the cooling gas supply part 150 may supply the cooling gas, which has a flow rate less than that when the power is supplied to the first and second power supply electrodes 121a and 121b. The first and second power supply electrodes 121a and 121b and the ground electrode 122 may generate the heat only when the plasma is generated by supplying the power to the first and second power supply electrodes 121a and 121b. For this reason, when the power is not supplied to the first and second power supply electrodes 121a and 121b because the plasma is not generated (or discharged), the cooling gas having a flow rate (e.g., approximately 3 slm) less than that (e.g., approximately 10 slm) when the power is supplied to the first and second power supply electrodes 121a and 121b may be supplied and also be discharged through the general atmospheric exhaust to save energy consumption.

The batch type substrate processing apparatus 100 in accordance with an embodiment may further include a plurality of first sealing caps 141 respectively connected to the first electrode protection tubes 131 and provided with an exhaust port 141a, through which the cooling gas is discharged, on the sidewall of the inner spaces communicating with the first electrode protection tubes 131, and a second sealing cap 142 connected to the second electrode protection tube 132 and provided with an inlet 142a, through which the cooling gas is supplied, on a sidewall of the inner space communicating with the second electrode protection tube 132.

The plurality of first sealing caps 141 may be respectively connected to the plurality of first electrode protection tubes 131 and may have an inner space communicating with each of the first electrode protection tubes 131 so that at least a portion of the first power supply electrode 121a or the second power supply electrode 121b is inserted (or accommodated). In addition, the plurality of first sealing caps 141 may be provided with the exhaust port 141a, through which the cooling gas is discharged in a radial direction, on the sidewall of the inner space communicating with each of the first electrode protection tubes 131. That is, the exhaust port 141a may be provided in a direction perpendicular to an extension direction of the first power supply electrode 121a or the second power supply electrode 121b.

For example, the plurality of first sealing caps 141 may be connected to the other ends (e.g., lower ends) of the plurality of first electrode protection tubes 131, respectively, and a first sealing member 135 such as an O-ring may be disposed between each of the first electrode protection tubes 131 and the first sealing cap 141. In addition, rear ends (or lower ends) of the first power supply electrode 121a and the second power supply electrode 121b may be drawn out through each of the first sealing caps 141. Here, each of the first power supply electrode 121a and the second power supply electrode 121b may be provided with a protrusion having a width wider than that of each of other portions accommodated in the inner space of the first sealing cap 141, and the protrusion may be hooked with a stepped portion of the rear end (e.g., the lower end) of each of the first sealing cap 141. Here, the protrusion may be provided so that each of the first power supply electrode 121a and the second power supply electrode 121b protrude itself or may be provided by adding the same material or another material to the first power supply electrode 121a and the second power supply electrode 121b. Here, a second sealing member 145 such as an O-ring may be disposed between the protrusion of the first power supply electrode 121a or the second power supply electrode 121b and the stepped portion of the rear end of each of the first sealing caps 141. Thus, the first power supply electrode 121a and the second power supply electrode 121b may be stably supported to prevent or suppress the sagging of the first power supply electrode 121a and the second power supply electrode 121b from occurring, and the other end of each of the first electrode protection tubes 131 may be sealed.

The second sealing cap 142 may be connected to the second electrode protection tube 132 and may have an inner space communicating with the second electrode protection tube 132 so that at least a portion of the ground electrode 122 is inserted. In addition, the second sealing cap 142 may be provided with the inlet 142a, through which the cooling gas is supplied in the radial direction, on the sidewall of the inner space communicating with the second electrode protection tube 132. That is, the inlet 142a may be provided in a direction perpendicular to the extension direction of the ground electrode 122.

For example, the second sealing cap 142 may be connected to the other end of the second electrode protection tube 132, and the first sealing member 135 may be disposed between the second electrode protection tube 132 and the second sealing cap 142. In addition, the rear end of the ground electrode 122 may be drawn out through the second sealing cap 142, and the ground electrode 122 may be provided with a protrusion having a width wider than that of each of other portions accommodated in the inner space of the second sealing cap 142 and thus be hooked with the stepped portion of the rear end of the second sealing cap 142. Here, the protrusion may be provided so that the ground electrode 122 itself protrudes or may be provided by adding the same material or another material to the ground electrode 122. Here, the second sealing member 145 may be disposed between the protrusion of the ground electrode 122 and the stepped portion at the rear end of the second sealing cap 142. Thus, the ground electrode 122 may be stably supported to prevent or suppress the sagging of the ground electrode 122, and the other end of the second electrode protection tube 132 may be sealed.

Since the cooling gas is supplied toward the side surface of the ground electrode 122 through the inlet 142a provided in the direction perpendicular to the extension direction of the ground electrode 122, the cooling gas may be quickly and effectively diffused along the side surface of the ground electrode 122. In addition, since the cooling gas flows to be in contact with the surface of the ground electrode 122, the heat-exchange between the ground electrode 122 and the cooling gas may be effectively performed. In addition, since the cooling gas flows quickly and effectively along the side surface of the first power supply electrode 121a or the second power supply electrode 121b through the exhaust port 141a provided in the direction perpendicular to the extension direction of the first power supply electrode 121a or the second power supply electrode 121b, the cooling gas may flow to be in contact with the surface of the first power supply electrode 121a or the second power supply electrode 121b so that the heat-exchange between the first power supply electrode 121a or the second power supply electrode 121b and the cooling gas is effectively performed.

In addition, the inlet 142a of the second sealing cap 142 and the exhaust port 141a of the first sealing cap 141 may have different sizes (or diameters) and/or numbers. For example, two inlets 142a that is more than the number of the exhaust ports 141a of the first sealing cap 141 may be provided in the second sealing cap 142 to supply a large amount of cooling gas to the second electrode protection tube 132 so that a sufficient amount of cooling gas is supplied by distributing the cooling gas into the plurality of first electrode protrusion tubes while effectively cooling the ground electrode 122. In addition, the exhaust port 141a of the first sealing cap 141 may have a size greater than that of the inlet port 142a of the second sealing cap 142 so that the cooling gas is effectively discharged through the exhaust port 141a of the first sealing cap 141.

The batch type substrate processing apparatus 100 in accordance with an exemplary embodiment may further include a gas supply tube 170 that supplies the process gas required for a process of processing a plurality of substrates 10, and an exhaust part 180 that exhausts the inside of the reaction tube 110.

The gas supply tube 170 may supply the process gas that is necessary for the process of processing the plurality of substrates 10 and may supply the process gas into the reaction tube 110 through the plasma formation part 120. In addition, the gas supply tube 170 may include a discharge port 171 that discharges (or injects) the process gas into the discharge space. Here, the plasma forming part 120 may be arranged in the longitudinal direction of the reaction tube 110 and include a plurality of injection holes 125a through which the radicals of the process gas decomposed by the plasma are supplied to the processing space 111. For example, the plurality of injection holes 125a may be defined in the partition wall 125 and may supply radicals to the processing space 111.

Here, the plurality of gas supply tubes 170 may be arranged to be symmetrical to each other about a (virtual) line extending from a center of the reaction tube 110 toward the ground electrode 122. As a result, the process gas may be uniformly supplied to the spaced space between the first power supply electrode 121a and the ground electrode 122 and the spaced space between the second power 10 supply electrode 121b and the ground electrode 122.

The exhaust part 180 may exhaust the inside of the reaction tube 110 and may be disposed to face the plasma formation part 120. The exhaust part 180 may be disposed in the processing space 111 to discharge the process residues in the processing space 111 to the outside. The exhaust part 180 may include an exhaust nozzle extending in the longitudinal direction (or vertical direction) of the reaction tube 110, an exhaust line connected to the exhaust nozzle, and an exhaust pump. The exhaust nozzle may face the injection hole 125a of the plasma formation part 130 and may include a plurality of exhaust holes arranged in the vertical direction corresponding to the unit processing spaces of the substrate boat.

Thus, the injection hole 125a of the plasma formation part 120 and the exhaust hole of the exhaust part 180 may correspond to each other and be disposed in the same line in the direction parallel to the surface of the substrate 10, which crosses the longitudinal direction of the reaction tube 110 on which the substrate 10 is loaded, and thus, the radicals injected from the injection hole 125a may be introduced into the exhaust hole to generate a laminar flow. Thus, the radicals injected from the injection holes 125a may be uniformly supplied to a top surface of the substrate 10

Here, the process gas may include one or more types of gases and may include a source gas and a reaction gas that reacts with the source gas to form a thin film material. For example, when the thin film material to be deposited on the substrate 10 is silicon nitride, the source gas may include a silicon-containing gas such as dichlorosilane ($SiH_2Cl_2$, abbreviation: DCS), and the reaction gas may include a nitrogen-containing gas such as $NH_3$, $N_2O$, No, and the like.

The batch type substrate processing apparatus 100 in accordance with an exemplary embodiment may further include a heating unit surrounding the reaction tube 110 to heat the plurality of substrates 10. In addition, the substrate boat may rotate by a rotating unit connected to a lower portion of the substrate boat for uniformity of the processing process.

In addition, the RF power may be supplied with RF power in a pulse form. The pulsed RF power may be adjusted in pulse width and duty ratio in a pulse frequency band of approximately 1 kHz to approximately 10 kHz. The duty ratio means a ratio of an on-cycle and an off-cycle. When the pulsed RF power is applied to the first and second power supply electrodes 121a and 121b, the plasma may be periodically turned on/off, i.e., the plasma may be generated in the form of a pulse. Thus, the density of the ions that damage the plurality of electrodes 121 and 122 and the partition wall 125 and generate the particles during the processing process may be reduced, whereas the density of the radicals may be constantly maintained. Thus, while maintaining efficiency of the processing process, the damage of the plurality of electrodes 121 and 122 and the partition wall 125 due to the plasma may be reduced or prevented from occurring.

As described above, in the exemplary embodiment, the plurality of electrodes exposed to the plasma atmosphere may be protected from the plasma while electrically insulating the plurality of electrodes through the electrode protection part, and the plurality of electrodes may be safely protected from the contamination or particles that may be generated by the plasma. In addition, the plurality of first electrode protection tubes may be respectively connected to the second electrode protection tubes through the plurality of connection tubes to constitute the electrode protection part, and thus, the interval between the first electrode protection tube and the second electrode protection tube may be maintained so that the interval between the first and second power supply electrodes and the ground electrode are uniformly maintained. Therefore, the spaced space between the first power supply electrode and the ground electrode and the spaced space between the second power supply electrode and the ground electrode may have the same volume so that the plasma density between the plurality of plasma generation spaces are uniform. In addition, each of the first electrode protection tubes may communicate with the second electrode protection tube through the plurality of connection tubes to generate the flow of the cooling gas through the cooling gas supply part and the cooling gas discharge part while supplying the cooling gas into the plurality of first electrode protection tubes and the second electrode protection tube. Therefore, the first and second power supply electrodes, which generates the heat while generating the plasma, and the ground electrode may be effectively cooled. Here, the cooling gas may be supplied to the second electrode protection tube provided in the ground electrode, which is affected by all the first power supply electrode and the second power supply electrode to generate the high-temperature heat due to the overlapping of the electric fields, to effectively cool the high-temperature heat of the ground electrode. In addition, since the large amount of cooling gas supplied to the second electrode protection tube is divided into the plurality of first electrode protection tubes and then is discharged, the flow of the cooling gas may be smooth. Here, the exhaust lines respectively connected to the plurality of first electrode protection tubes may be connected to the pumping port to quickly discharge the cooling gas, which is heated due to the heat-exchange with the ground electrode, the first power supply electrode and/or the second power supply electrode, thereby realizing the more effective cooling. Since the exhaust pressure of approximately 0.15 mbar or more per approximately 1 slm flow rate of the cooling gas is generated in the exhaust line, the first power supply electrode and/or the second power supply electrode may be inclined to uniformly supply the cooling gas to the plurality of first electrode protection tubes even when the interval from the first electrode protection tube is not uniform.

The batch type substrate processing apparatus in accordance with the exemplary embodiment may electrically insulate the plurality of electrodes and simultaneously protect the plurality of electrodes, which are exposed to the plasma atmosphere, from the plasma through the electrode protection part and also safely protect the plurality of electrodes from the contamination or particles, which may occur by the plasma. In addition, the plurality of first electrode protection tubes may be respectively connected to the second electrode protection tubes through the plurality of connection tubes to constitute the electrode protection part, and thus, the interval between the first electrode protection tube and the second electrode protection tube may be maintained so that the interval between the first and second power supply electrodes and the ground electrode are uniformly maintained. Therefore, the spaced space between the first power supply electrode and the ground electrode and the spaced space between the second power supply electrode and the ground electrode may have the same volume so that the plasma density between the plurality of plasma generation spaces are uniform.

In addition, each of the first electrode protection tubes may communicate with the second electrode protection tube through the plurality of connection tubes to generate the flow of the cooling gas through the cooling gas supply part and the cooling gas discharge part while supplying the cooling gas into the plurality of first electrode protection tubes and the second electrode protection tube. Therefore, the first and second power supply electrodes, which generates the heat while generating the plasma, and the ground electrode may be effectively cooled.

Here, the cooling gas may be supplied to the second electrode protection tube provided in the ground electrode, which is affected by all the first power supply electrode and the second power supply electrode to generate the high-temperature heat due to the overlapping of the electric fields, to effectively cool the high-temperature heat of the ground electrode. In addition, since the large amount of cooling gas supplied to the second electrode protection tube is divided into the plurality of first electrode protection tubes and then is discharged, the flow of the cooling gas may be smooth.

Here, the exhaust lines respectively connected to the plurality of first electrode protection tubes may be connected to the pumping port to quickly discharge the cooling gas, which is heated due to the heat-exchange with the ground electrode, the first power supply electrode and/or the second power supply electrode, thereby realizing the more effective cooling.

Since the exhaust pressure of approximately 0.15 mbar or more per approximately 1 slm flow rate of the cooling gas is generated in the exhaust line, the first power supply electrode and/or the second power supply electrode may be inclined to uniformly supply the cooling gas to the plurality of first electrode protection tubes even when the interval from the first electrode protection tube is not uniform.

Although embodiments have been described with reference to a number of illustrative embodiments thereof, the embodiments are not limited to the foregoing embodiments, and thus, it should be understood that numerous other modifications and embodiments can be devised by those skilled in the art that will fall within the spirit and scope of the principles of this disclosure. Hence, the real protective scope of the present invention shall be determined by the technical scope of the accompanying claims.

What is claimed is:
1. A batch type substrate processing apparatus comprising:
 a reaction tube having a processing space in which a plurality of substrates are accommodated;
 a plurality of electrodes extending along a longitudinal direction of the reaction tube and disposed to be spaced apart from each other; and
 an electrode protection part configured to protect the plurality of electrodes,
 wherein the plurality of electrodes comprise:
  first and second power supply electrodes spaced apart from each other; and
  a ground electrode provided between the first power supply electrode and the second power supply electrode,
 wherein the electrode protection part comprises:
  a plurality of first electrode protection tubes provided in the first and second power supply electrodes, respectively;
  a second electrode protection tube provided in the ground electrode; and
  a plurality of connection tubes configured to connect each of the plurality of first electrode protection tubes to the second electrode protection tube so as to communicate with each other,
 wherein the substrate processing apparatus further comprises:
  a cooling gas supply part configured to supply a cooling gas into the plurality of first electrode protection tubes and the second electrode protection tube; and
  a cooling gas discharge part configured to discharge the cooling gas from the plurality of first electrode protection tubes and the second electrode protection tube so as to generate a flow of the cooling gas,
  wherein a flow rate of the cooling gas in each of the first electrode protection tubes is less than that of the cooling gas in the second electrode protection tube.

2. The batch type substrate processing apparatus of claim 1, wherein the plurality of electrodes generate capacitively coupled plasma (CCP) in a spaced space between the first power supply electrode and the ground electrode and a spaced space between the second power supply electrode and the ground electrode.

3. The batch type substrate processing apparatus of claim 1, wherein the cooling gas supply part is connected to the second electrode protection tube, and
the cooling gas discharge part is connected to each of the plurality of first electrode protection tubes.

4. The batch type substrate processing apparatus of claim 3, wherein the cooling gas discharge part comprises an exhaust line connected to each of the plurality of first electrode protection tubes.

5. The batch type substrate processing apparatus of claim 4, wherein the cooling gas discharge part further comprises a diameter adjusting member configured to adjust an inner diameter of the exhaust line.

6. The batch type substrate processing apparatus of claim 4, wherein the exhaust line comprises:
a first exhaust line connected to a pumping port; and
a second exhaust line branched with the first exhaust line, wherein the cooling gas discharge part further comprises:
a first valve provided in the first exhaust line; and
a second valve provided in the second exhaust line.

7. The batch type substrate processing apparatus of claim 6, wherein the first valve is opened when power is supplied to the first and second power supply electrodes, and
the second valve is opened when power is not supplied to the first and second power supply electrodes.

8. The batch type substrate processing apparatus of claim 4, wherein the exhaust line has an exhaust pressure of approximately 0.15 mbar or more per 1 slm of a flow rate of the cooling gas.

9. The batch type substrate processing apparatus of claim 3, wherein each of the plurality of connection tubes has an inner diameter less than that of each of the plurality of first electrode protection tubes and the second electrode protection tube.

10. The batch type substrate processing apparatus of claim 1, wherein the cooling gas comprises an inert gas.

11. The batch type substrate processing apparatus of claim 1, wherein the cooling gas supply part is configured to supply the cooling gas so that a flow rate of the cooling gas when power is not supplied to the first and second power supply electrodes is less than that of the cooling gas when power is supplied to the first and second power supply electrodes.

12. The batch type substrate processing apparatus of claim 1, further comprising:
a plurality of sealing caps which are connected to the plurality of first electrode protection tubes, respectively, and in which an exhaust port, through which the cooling gas is discharged, is provided in a sidewall of an inner space communicating with each of the first electrode protection tubes; and
a second sealing cap which is connected to the second electrode protection tube and in which an inlet, through which the cooling gas is supplied, is provided in a sidewall of an inner space communicating with the second electrode protection tube.

* * * * *